United States Patent [19]

Matsuo et al.

[11] Patent Number: 4,543,266
[45] Date of Patent: Sep. 24, 1985

[54] METHOD OF FABRICATING A MEMBRANE STRUCTURE

[75] Inventors: Seitaro Matsuo, Isehara; Mikiho Kiuchi, Zama; Misao Sekimoto, Yokohama, all of Japan

[73] Assignee: Nippon Telegraph & Telephone Public Corporation, Tokyo, Japan

[21] Appl. No.: 660,551

[22] Filed: Oct. 15, 1984

Related U.S. Application Data

[63] Continuation of Ser. No. 530,082, Sep. 7, 1983, abandoned.

[30] Foreign Application Priority Data

Sep. 10, 1982 [JP] Japan .................. 57-156844

[51] Int. Cl.⁴ ............................................. B05D 5/12
[52] U.S. Cl. ...................................... 427/38; 427/82; 427/272; 427/275; 427/379
[58] Field of Search .................... 427/38, 82, 272, 275, 427/379

[56] References Cited

U.S. PATENT DOCUMENTS 3,540,926 11/1970 Rairden, III ................ 427/397.7 X
4,284,678 8/1981 Jones .
4,401,054 8/1983 Matsuo et al. ................. 118/724 X

FOREIGN PATENT DOCUMENTS 2076587 12/1981 United Kingdom .

OTHER PUBLICATIONS

Journal of the Electrochemical Society, vol. 129 (1982), Mar., No. 3, Manchester, N.H., p. 112C.
Japanese Journal of Applied Physics, vol. 17, No. 9 (1978), pp. 1693-1694.
IBM Technical Disclosure Bulletin, vol. 21, No. 10, Mar. 1979, pp. 4247-4248.
Misao Sekimoto et al.; "Silicon Nitride Single-Layer X-Ray Mask" J. Vac. Sci. Technol., 21(4), Nov./Dec. 1982; pp. 1017-1021.

Primary Examiner—Bernard D. Pianalto
Attorney, Agent, or Firm—Spencer & Frank

[57] ABSTRACT

A thin film which becomes a membrane is formed over one major surface of a substrate by a plasma deposition process utilizing microwave electron cyclotron resonance. The substrate is then removed, other than a portion of the substrate which remains as a frame, so as to form a membrane structure. A dense and high quality membrane is formed at a low temperature and the internal stress of the membrane controlled by varying the conditions under which the plasma deposition process is carried out and by heat treating the thin film after its formation.

12 Claims, 8 Drawing Figures

FIG._1A
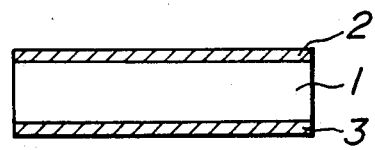
FIG._1B
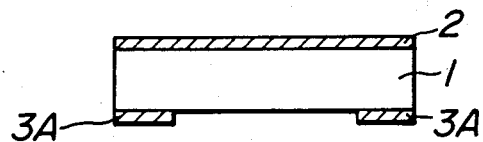
FIG._1C
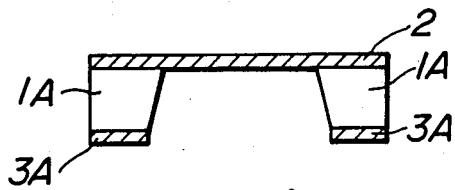
FIG._1D
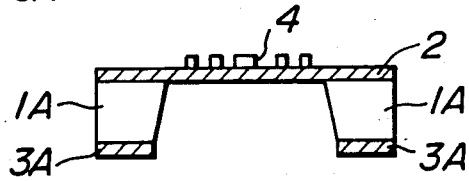
FIG._1E FIG_2
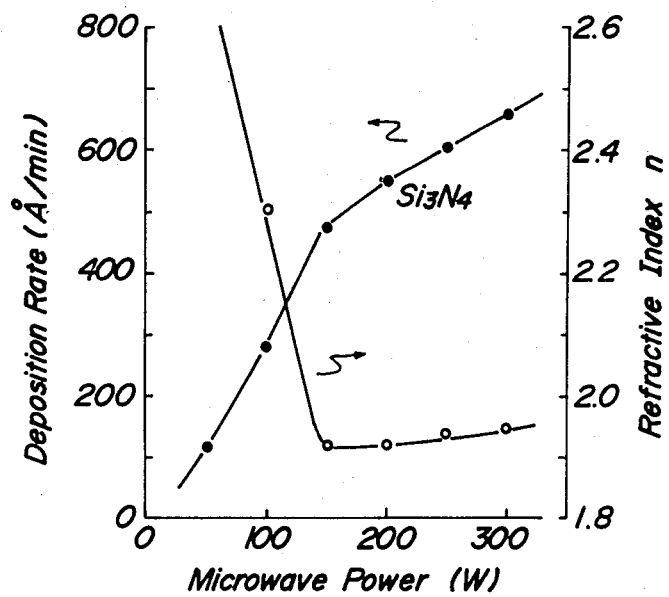

METHOD OF FABRICATING A MEMBRANE STRUCTURE

This application is a continuation of application Ser. No. 530,082, filed Sept. 7, 1983, now abandoned.

BACKGROUND OF THE INVENTION

1. Field of the Invention

The present invention relates generally to a process for fabricating a membrane structure and more particularly to a process for fabricating a membrane structure which is especially adapted for use as a mask substrate for X-ray lithography in which a fine pattern is transferred and exposed by using soft X-rays to form a pattern for the manufacture of electronic devices such as integrated semiconductor devices.

2. Description of the Prior Art

In a conventional process for fabricating a membrane structure, a first thin film which becomes a membrane is first formed over one major surface of a substrate. Simultaneous with or after the formation of the thin film over one major surface of the substrate, a second thin film is also formed over the other major surface of the substrate. Thereafter, the second thin film is removed by a suitable treatment like photo-etching except a portion which remains as a frame. Next, the substrate is removed except a portion, which remains as a frame, by using an etchant which etches only the substrate, whereby a membrane structure is obtained.

Such membrane structure is used as a substrate for fabricating a mask for X-ray lithography. In this case, not only must the membrane have a high degree of transparency to X-ray but it must also be sufficiently transparent over the whole wavelength range of visible light in order to use effectively an optical alignment apparatus which is used to align patterns with a high degree of precision when the patterns are transferred by using X-rays. The most fundamental requirement for membrane structure resides in the fact that a membrane is subjected to tension with a suitable tensile stress, so that it is prevented from sagging. Therefore, it is preferable that the membrane has a tensile stress from $0.5 \times 10^9$ dyne/cm$^2$ to $3 \times 10^9$ dyne/cm$^2$.

In order to fabricate a membrane consisting of an inorganic material especially such as silicon nitride ($Si_3N_4$), the Chemical Vapor Deposition (CVD) process has widely been used in which a gas such as $SiH_2Cl_2$ or $NH_3$ is used as a raw material and the thermal reaction between $SiH_2Cl_2$ and $NH_3$ is utilized at a high temperature (700°–900° C.). When the CVD process is employed so as to form a $Si_3N_4$ film which becomes a membrane, the film generally has a high tensile stress (of the order of $10^{10}$ dyne/cm$^2$). Therefore, M. Sekimoto et al. proposed that a thin film of silicon rich SiN$x$ ($x<4/3$) be formed by controlling the reaction temperature and the composition of gases so that the tensile stress may be reduced (See "Silicon nitride single-layer X-ray mask", J. Vac. Sic. Technol. 21(4), Nov./Dec. 1982, pp. 1017–1021). But, this process has a defect that transparency to visible light, especially light on the short wavelength side, is degraded considerably. Furthermore, it has disadvantages in that the stress cannot be controlled optimally and a high yield cannot be ensured.

SUMMARY OF THE INVENTION

With the above in view, one of the objects of the present invention is to provide a process for fabricating a membrane structure having a membrane which is highly transparent to visible light, whose stress can be optimally controlled and which is highly reliable and dependable in operation.

To this and other ends, according to the present invention, a thin film which becomes a membrane is formed on a substrate by the plasma deposition process utilizing the electron cyclotron resonance generated by microwave energy and the thin film is further heat treated so that it may have the desired stress.

More specifically, the process for fabricating a membrane structure comprises a first step of forming a thin film which becomes a membrane over a first major surface of a substrate by a plasma deposition process which utilizes electron cyclotron resonance of microwave energy; and a second step of removing a portion of said substrate other than a portion which remains as a frame to form the membrane structure.

It is preferable that after the formation of said thin film the thin film is subjected to heat treatment so that the internal stress of the thin film as a membrane may be adjusted.

Alternatively, in the first step, the plasma deposition process may be carried out while heating the substrate in order to adjust an internal stress of the film as a membrane.

It is preferable that the second step comprises a first sub-step of forming a second or further thin film over the other or second major surface of the substrate by, for example, plasma deposition process utilizing microwave electron cyclotron resonance; a second sub-step of removing the second thin film other than a portion which serves as a mask pattern for the formation of a frame of the substrate; and a third sub-step of removing said substrate other than a portion which remains as the frame of the substrate, the mask pattern for the frame being used as a mask.

The portion of the substrate which remains as the frame may consist of a material with a low coefficient of thermal expansion and with a high degree of dimensional accuracy, while the remaining portion of the substrate consists of a material which is easily dissolved away, and in the second step, the remaining portion of said substrate is removed by a solvent.

Silicon nitride may be used as a material to form the membrane.

Further an X-ray absorption pattern for X-ray lithography may be formed on the first thin film which becomes a membrane on said substrate, whereby the thus obtained membrane structure is used as a mask for X-ray lithography.

BRIEF DESCRIPTION OF THE DRAWINGS

FIGS. 1A through 1E are cross sections showing sequential steps for fabricating a membrane structure in accordance with the present invention;

FIG. 2 illustrates the relationships between deposition rate and refractive index (n) with microwave power when $Si_3N_4$ films are formed by an ECR plasma deposition process;

DETAILED DESCRIPTION OF THE PREFERRED EMBODIMENTS

FIG. 1A through FIG. 1E show one example of steps for the manufacture of a membrane in accordance with the present invention. As shown in FIG. 1A, as a substrate 1 use was made of a (100) silicon wafer having a diameter of two or three inches and having a thickness of 0.4 mm. A thin film 2 which becomes a membrane, of $Si_3N_4$ was deposited by 0.5-2 $\mu$m in thickness on the surface of the substrate 1 by an ECR (electron cyclotron resonance) plasma deposition process. The apparatus used for the ECR plasma deposition process is disclosed in detail in Japanese patent application No. 57,877/1980 (Japanese Laid Open patent application No. 155,535/1981) or the corresponding U.S. patent application Ser. No. 257,616 now U.S. Pat. No. 4,401,054. In the deposition process, the $Si_3N_4$ film was formed by using $N_2$ and $SiH_4$ gases at a low temperature without heating the substrate 1.

The composition and stress of the $Si_3N_4$ film 2 can be controlled over a wide range by changing the conditions of the ECR plasma deposition process such as flow rates of gases, gas pressures, microwave power and the like. Thus, by controlling such deposition conditions as described above, the deposited $Si_3N_4$ film may have a stoichiometric composition of $Si_3N_4$ and while a high degree of transparency is maintained the deposited film has various stress conditions, i.e., the film may have a compressive stress, may be free of stress or may have a weak tensile stress, without heating in the deposition step. Here, a weak tensile stress satisfies the conditions of a membrane.

FIG. 2 illustrates the relationships between microwave power on the one hand and the deposition rate and refractive index on the other hand. In the experiments, the gas introduction conditions are as follows; the flow rate of $N_2$ was 30 cc/min; the flow rate of $SiH_4$ was 20 cc/min; and the gas pressure was maintained at $5 \times 10^{-4}$ Torr. Even with the high microwave power of more than 150 W, films with a high degree of transparency and a substantially constant refractive index (n=1.9–2.0) were obtained.

Figure 3:
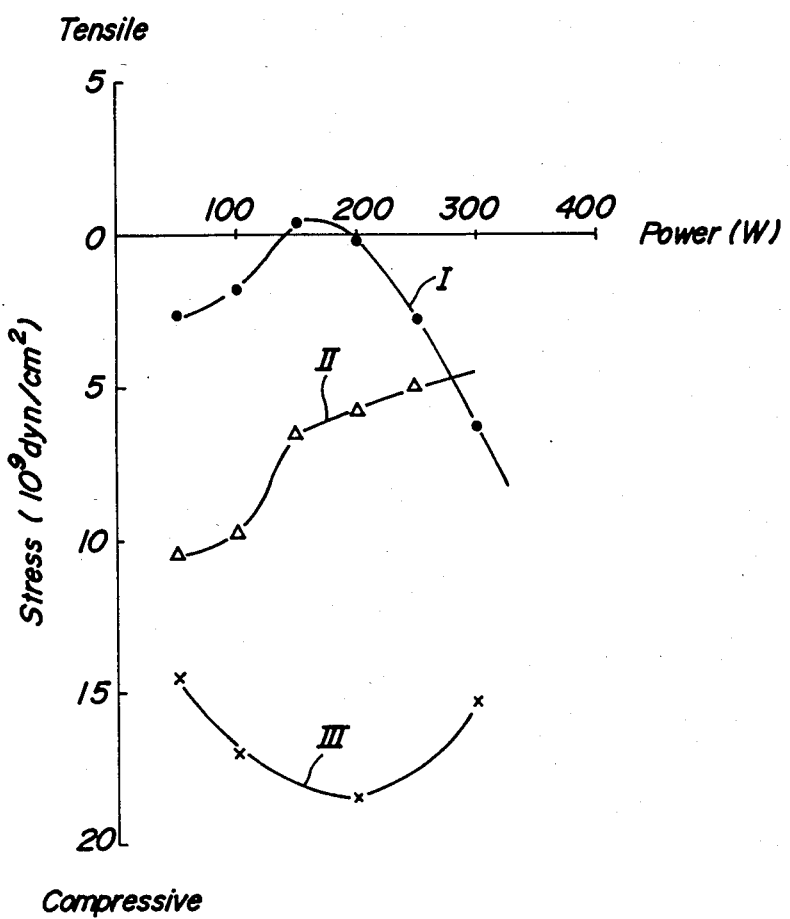
FIG. 3 illustrates experimental results of a relationship between microwave power and stress which in turn shows how stresses of silicon nitride films can be controlled in response to plasma deposition conditions.

As shown by the characteristic curve I in FIG. 3, when the power was 150 W the film had a weak tensile stress; when the power was 200 W the film was free from stress; and when the power was higher than, 200 W, a film, has compressive stresses. In the case where the power was 200 W at which the film had no stress, the deposition rate was 550 Å/min, so that a film can be deposited in a very efficient manner. The thus obtained $Si_3N_4$ films were very dense and the etch rate was less than 80 Å/min when a buffer hydrofluoric acid solution (50% HF:40% $NH_4F$=15:85, at 20° C.) was used. The etch rate was substantially the same as that formed when $Si_3N_4$ films were formed at a high temperature of 800° C. by CVD.

FIG. 3 also illustrates the relationship between microwave power and stress when plasma deposition conditions such as gas flow rates and gas pressure were varied. The substrate was not heated. The characteristic curves I, II and III as shown in FIG. 3 are obtained under the following conditions:

| characteristic curve | gas introduction conditions | | |
|---|---|---|---|
| | $N_2$ (cc/min) | $SiH_4$ (cc/min) | gas pressure (Torr) |
| I | 30 | 20 | $5 \times 10^{-4}$ |
| II | 15 | 10 | $3 \times 10^{-4}$ |
| III | 10 | 10 | $2 \times 10^{-4}$ |

When the prior art high-temperature CVD method was employed, a film with a high degree of tensile stress is obtained, but when the ECR plasma process in accordance with the present invention is used, films may be obtained having compressive stresses as shown in FIG. 3. The stresses of the films were especially influenced by the gas pressure and the least stress was obtained when the gas pressure was about $5 \times 10^{-4}$ Torr. When the gas pressure was in excess of $5 \times 10^{-4}$ Torr, for instance, about $10^{-3}$ Torr, the density of the film was degraded. That is, a film with a high density was not obtained without heating the substrate.

In order to control or attain a suitable stress, it is of course possible to heat the substrate during deposition. In this case, there exists a tendency as will be described below with reference to FIG. 4.

In the step shown in FIG. 1B, an $Si_3N_4$ film 3 having a thickness of 0.2–0.5 mm was deposited on the substrate 1 by the ECR plasma deposition process under the same conditions as described above.

Figure 4:
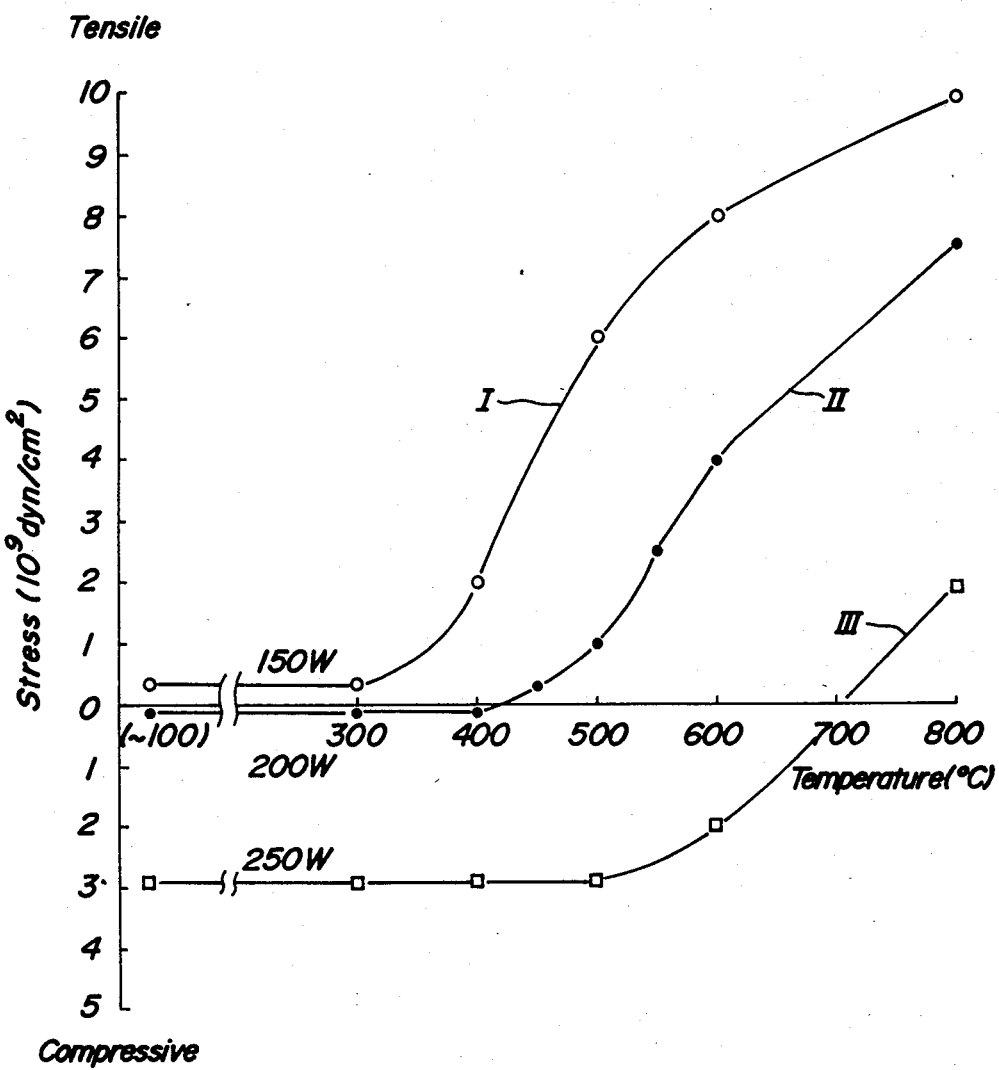
FIG. 4 illustrates experimental results of a relationship between heat treatment temperature and stress which in turn shows how stresses of silicon nitride films can be controlled in response to the heat treatment temperature.

The film thus deposited was subjected to a heat treatment, so that its tensile stress could be controlled with a high degree of accuracy. FIG. 4 illustrates the relationship between heat treatment temperature and stress of the $Si_3N_4$ film which was deposited under the following deposition conditions, when the heat treatment was carried out for 30 minutes in vacuum after deposition. The deposition conditions were that the substrate was not heated, and that the gas introduction conditions were as follows —$N_2$ was introduced at the rate of 30 cc/min and $SiH_4$ at the rate of 20 cc/min, and that the gas pressure was maintained at $5 \times 10^{-4}$ Torr. Characteristic curves I, II and III were obtained, when the microwave powers were 150, 200 and 250 W, respectively.

As indicated by the characteristic curve I, there was no variation in stress up to 300° C. when the power was 150 W, but the stress increased on the side of tensile stress when the heat treatment temperature exceeded 300° C. As indicated by the characteristic curve II, there was no substantial variation in stress up to 400° C. when the microwave power was 200 W, but the stress gradually increased from the compressive side to the tensile side, when the heat treatment temperature increased beyond 400° C. and it increased almost linearly when the heat treatment temperature increased beyond 500° C. As indicated by the characteristic curve III, there was no variation in stress up to 500° C., but if the heat treatment temperature exceeded 500° C., the stress changed toward tensile stress.

As described above, by suitably selecting the conditions of heat treatment, the stress of a $Si_3N_4$ film can be controlled with a high degree of accuracy to a desired value within the preferable range between $0.5 \times 10^9$ dyne/cm$^2$–$3 \times 10^9$ dyne/cm$^2$. For instance, in order to obtain a stress of $1 \times 10^9$ dyne/cm$^2$, the film is heat treated at 360° C. with a microwave power of 150 W or at 500° C. with a microwave power of 200 W or at 750°

C. with the microwave power of 250 W. Instead of the heat treatment in vacuum, the heat treatment in the atmosphere of $N_2$ or air can easily be carried out, since the $Si_3N_4$ film is very stable.

The step for forming a film and the step for heat treating the film may be carried out independently, so that the control flexibility can be improved and reliability in treatment can be increased.

While in the above embodiment the $Si_3N_4$ film is deposited without heating the substrate during the deposition and thereafter the $Si_3N_4$ film thus formed is subjected to the heat treatment so that the film has a suitable stress, the substrate may be heated to provide a suitable stress to the $Si_3N_4$ film during the deposition of the film, so that the succeeding heat treatment to the $Si_3N_4$ film may be omitted. In the latter case, characteristics similar to FIG. 4 can be obtained in accordance with the temperature at which the substrate is heated.

In the step shown in FIG. 1C, except the portion of the $Si_3N_4$ film 3A which remains as a mask pattern of a frame, the $Si_3N_4$ film 3 was removed. To this end, a photo patterning was applied to the film 3 and then the film 3 was etched by reactive sputter etching with a $C_2F_6$ gas. As a result, except the frame portion 3A, the film 3 was easily removed as shown in FIG. 1C.

Thereafter, in the step shown in FIG. 1D, the silicon substrate 1 was etched with, for instance, 20% KOH solution heated at 100° C., with the $Si_3N_4$ film 3A being used as a mask. Consequently, the portion 1A which serves as a frame remained as shown in FIG. 1D, so that a membrane structure with the membrane 2 and the frame portions 1A was and 3A obtained as shown in FIG. 1D.

By the steps 1A through 1D, a $Si_3N_4$ membrane having a thickness of 0.5–2 μm and with an area of 20×20 mm was obtained with a high yield.

The thus obtained membrane was highly transparent to visible light and the wavelength of light transmitted through the membrane extended to 3,200 Å; that is, the ultraviolet region.

While in the above example, the substrate 1 has been described as consisting of silicon, it is to be understood that the substrate 1 may be made of other materials.

According to the present invention, the $Si_3N_4$ film 2 which becomes a membrane can be formed at a low temperature (less than 100° C. or so) without heating the substrate 1, so that a material which has a relatively low degree of resistance to heat can be used advantageously as a substrate.

For instance, the frame portion 1A of the substrate 1 may consist of a material such as quartz glass with a low coefficient of thermal expansion and a high degree of dimensional accuracy, while the remaining portion which is to be removed by etching or the like may consist of an organic material or a salt which is easily dissolved away. In this case, after the thin film 2 which becomes a membrane is formed over the entire surface of the substrate 1 at a low temperature, except the frame portion 1A of the substrate 1, the substrate 1 is removed with a suitable etchant, whereby the membrane is formed. Thereafter, in order to control the stress of the membrane, the membrane may be subjected to the heat treatment as described above.

In addition to $Si_3N_4$, a material with a low X-ray absorption coefficient such as BN (boron nitride) or SiC (silicon carbide) may be used as a material of the thin film 2. In this case, two independent stress control steps or conditions are used; that is, conditions for plasma deposition and heat treatment can be employed in order to provide an optimum stress to the film.

In the case of the fabrication of a mask for use in X-ray lithography, a material with a high atomic weight and a high X-ray absorption coefficient such as Au, Pt, W or Ta is used to form an X-ray absorption pattern 4 as shown in FIG. 1E. This step for forming an X-ray absorption pattern may be carried out after the step shown in FIG. 1B or 1C.

As described above, according to the present invention, a thin film with a high density and a high quality can be formed at a low temperature by utilizing a plasma produced by the electron cyclotron resonance of microwave energy and the internal stress of the thin film which becomes a membrane can be controlled by varying the plasma deposition conditions, so that a membrane structure can be formed. Furthermore, a membrane structure can be manufactured in such a way that the internal stress of the thin film is controlled to a desired value with a high degree of accuracy by heat treating the thin film after the formation of the thin film. Therefore, according to the present invention, a membrane consisting of a thin $Si_3N_4$ film with an extremely high degree of transparency to light and a high quality can be fabricated with a high yield. In addition, according to the present invention, a thin film which becomes a membrane can be formed at a low temperature, so that a substrate with a relatively low resistance to heat can be used. Thus, the steps of fabricating a membrane structure are much facilitated.

According to the present invention, a $Si_3N_4$ membrane which is highly transparent to visible light can be obtained. The membrane structure can be used as a mask in X-ray lithography, so that the patterns can be aligned with a high degree of accuracy in the case of pattern transfer by using an optical alignment apparatus.

Moreover, according to the present invention, the process can be carried out at a low temperature, so that the fabrication time can be shortened and a high yield can be ensured. In addition, since substrates with a low resistance to heat can be used, the fabrication process can be considerably improved.

The membrane structure thus fabricated in accordance with the present invention can advantageously be used as an X-ray extraction aperture or window for extracting X-rays from vacuum into the air atmosphere in an X-ray lithography apparatus.

What is claimed is:

1. A process for fabricating a membrane structure having a predetermined internal stress, comprising the steps of
    (a) providing a substrate having first and second surfaces;
    (b) forming by plasma deposition over the first surface of said substrate a thin film selected from the group consisting essentially of silicon nitride, boron nitride and silicon carbide, said plasma deposition utilizing microwave electron cyclotron resonance generated by microwave power within the range 150 to 250 watts, the temperature of said substrate after deposition reaching a value determined primarily by the heat generated by said plasma deposition;
    (c) heating said substrate, after deposition of said thin film on the first surface thereof, to a temperature in the range 300°–800° C., said temperature being higher than the temperature of said substrate after plasma deposition of said thin film and dependent upon the value of said microwave power within said range of 150 to 250 watts; and (d) removing a portion of said substrate to provide a frame supporting said thin film, whereby a membrane structure is formed having an internal stress in the range $0.5 \times 10^9$ to $3 \times 10^9$ dyne/cm$^2$, the amount of said stress being determined by the temperature to which said substrate was heated in step (c) after deposition of said thin film.

2. A process for fabricating a membrane structure as claimed in claim 1, wherein the step (c) the temperature to whcih said substrate is heated is at least 300° C. when said microwave power is 150 watts, at least 400° C. when said microwave power is 200 watts and at least 500° C. when said microwave power is 250 watts.

3. A process for fabricating a membrane structure as claimed in claim 1, wherein in said step (b), said plasma deposition process is carried out without heating said substrate.

4. A process for fabricating a membrane structure as claimed in claim 1, wherein the portion of said substrate comprising said frame consists of a material having a low coefficient of thermal expansion and a high degree of dimensional accuracy, the other portion of said substrate comprising an easily dissolved material, and wherein in step (d) the portion of said substrate removed is dissolved by a solvent.

5. A process for fabricating a membrane structure as claimed in claim 3, wherein said step (d) further comprises:
a first sub-step of forming a further thin film over the second surface of said substrate; and
a second sub-step of removing a portion of said further thin film, the remaining portion of said further thin film serving as a mask pattern for the formation of said frame, said removal of a portion of said substrate following said first and second sub-steps.

6. A process for fabricating a membrane structure as claimed in claim 3, wherein an X-ray absorption pattern for X-ray lithography is formed on said thin film, whereby the thus obtained membrane is used as a mask for said X-ray lithography.

7. A process for fabricating a membrane structure as claimed in claim 5, wherein an X-ray absorption pattern for X-ray lithography is formed on said thin film, whereby the thus obtained membrane is used as a mask for said X-ray lithography.

8. A process for fabricating a membrane structure as claimed in claim 7, wherein said X-ray absorption pattern is formed after step (d).

9. A process for fabricating a membrane structure as claimed in claim 7, wherein said X-ray absorption pattern is formed after said first sub-step.

10. A process for fabricating a membrane structure as claimed in claim 7, wherein said X-ray absorption pattern is formed after said second sub-step.

11. A process for fabricating a membrane structure as claimed in claim 5, wherein said further thin film is formed by plasma deposition utilizing microwave electron cyclotron resonance.

12. A process for fabricating a membrane structure as claimed in claim 1, wherein said step (d) further comprises:
a first sub-step of forming a further thin film over the second surface of said substrate; and
a second sub-step of removing a portion of said further thin film, the remaining portion of said further thin film serving as a mask pattern for the formation of said frame, said removal of a portion of said substrate following said first and second sub-steps.

* * * * *